US012577459B2

(12) United States Patent
Jang et al.

(10) Patent No.: US 12,577,459 B2
(45) Date of Patent: Mar. 17, 2026

(54) QUANTUM DOT DEVICE AND ELECTRONIC DEVICE INCLUDING THE SAME

(71) Applicants: Samsung Electronics Co., Ltd., Suwon-si (KR); The Governing Council of the University of Toronto, Toronto (CA)

(72) Inventors: Eun Joo Jang, Suwon-si (KR); Seungjin Lee, Toronto (CA); Edward Sargent, Toronto (CN); Kwanghee Kim, Seoul (KR); Yuho Won, Seoul (KR)

(73) Assignees: SAMSUNG ELECTRONICS CO., LTD., Gyeonggi-do (KR); SAMSUNG DISPLAY CO., LTD., Gyeonggi-do (KR); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 936 days.

(21) Appl. No.: 17/708,245

(22) Filed: Mar. 30, 2022

(65) Prior Publication Data

US 2022/0325179 A1 Oct. 13, 2022

(30) Foreign Application Priority Data

Mar. 30, 2021 (KR) ........................ 10-2021-0041430

(51) Int. Cl.
*C09K 11/88* (2006.01)
*C01G 9/00* (2006.01)
(Continued)

(52) U.S. Cl.
CPC .............. *C09K 11/70* (2013.01); *C01G 9/006* (2013.01); *C01G 9/08* (2013.01); *C01G 15/00* (2013.01);
(Continued)

(58) Field of Classification Search
None
See application file for complete search history.

(56) References Cited

U.S. PATENT DOCUMENTS 8,847,240 B2 9/2014 Chung et al.
11,552,266 B2 1/2023 Sparrowe et al.
(Continued)

FOREIGN PATENT DOCUMENTS

CN 107565033 B * 2/2021
GB 2516607 A 2/2015
(Continued)

OTHER PUBLICATIONS

Bing Shan et al., "Generation of Long-Lived Redox Equivalents in Self-Assembled Bilayer Structures on Metal Oxide Electrodes," The Journal of Physical Chemistry C, Feb. 27, 2017, pp. A-I, DOI: 10.1021/acs.jpcc.6b12416.
(Continued)

*Primary Examiner* — Tae H Yoon
(74) *Attorney, Agent, or Firm* — CANTOR COLBURN LLP

(57) ABSTRACT

A quantum dot device and an electronic device including the device are provided. The quantum dot device includes a first electrode and a second electrode, a quantum dot layer disposed between the first electrode and the second electrode, and a hole auxiliary layer disposed between the quantum dot layer and the first electrode, wherein the hole auxiliary layer includes nickel oxide and a self-assembled monolayer disposed between the hole auxiliary layer and the quantum dot layer, the self-assembled monolayer including an organic compound represented by Chemical Formula 1.

18 Claims, 1 Drawing Sheet

(51) Int. Cl.

| | |
|---|---|
| ***C01G 9/08*** | (2006.01) |
| ***C01G 15/00*** | (2006.01) |
| ***C09K 11/55*** | (2006.01) |
| ***C09K 11/70*** | (2006.01) |
| ***H10K 85/00*** | (2023.01) |
| *B82Y 20/00* | (2011.01) |
| *B82Y 30/00* | (2011.01) |
| *B82Y 40/00* | (2011.01) |
| *H10K 50/11* | (2023.01) |
| *H10K 50/115* | (2023.01) |
| *H10K 101/30* | (2023.01) |
| *H10K 101/40* | (2023.01) |
| *H10K 102/00* | (2023.01) |

(52) U.S. Cl.

CPC ............ *C09K 11/55* (2013.01); *C09K 11/883* (2013.01); *H10K 85/00* (2023.02); *B82Y 20/00* (2013.01); *B82Y 30/00* (2013.01); *B82Y 40/00* (2013.01); *C01P 2004/64* (2013.01); *C01P 2006/60* (2013.01); *H10K 50/11* (2023.02); *H10K 50/115* (2023.02); *H10K 2101/30* (2023.02); *H10K 2101/40* (2023.02); *H10K 2102/00* (2023.02)

(56) References Cited

U.S. PATENT DOCUMENTS

| | | | |
|---|---|---|---|
| 2007/0069637 | A1 | 3/2007 | Jang et al. |
| 2018/0342706 | A1 | 11/2018 | Zhang |
| 2021/0305529 | A1 | 9/2021 | Lee et al. |

FOREIGN PATENT DOCUMENTS

| | | | | |
|---|---|---|---|---|
| JP | 2004149390 | A | * | 5/2004 |
| KR | 20070035734 | A | | 4/2007 |
| KR | 20130009141 | A | | 1/2013 |
| KR | 20140109829 | A | | 9/2014 |
| KR | 20160076013 | A | | 6/2016 |
| KR | 101732877 | B1 | | 5/2017 |
| KR | 102062856 | B1 | | 1/2020 |
| KR | 20200051027 | A | | 5/2020 |

OTHER PUBLICATIONS

Chia-Wei Liu et al., "Improved efficiency of organic light-emitting diodes with self-assembled molybdenum oxide hole Injection layers," Journal of Applied Physics, May 15, 2017, pp. 195501(1-5), vol. 121.

E. Vitoratos et al., "Thermal degradation mechanisms of PEDOT:PSS," Organic Electronics, Oct. 21, 2008, pp. 61-66, vol. 10.

Eunjoo Jang et al., "White-Light-Emitting Diodes with Quantum Dot Color Converters for Display Backlights," Adv. Mater. May 31, 2010, pp. 3076-3080, vol. 22.

Krishna P. Acharya et al., "High efficiency quantum dot light emitting diodes from positive aging, " Nanoscale, Aug. 25, 2017, pp. 14451-14457, vol. 9.

Liwei Zheng et al., "Quantum-dot light-emitting diodes with NiO and NiO:Mg as hole injection layer," 2019 18th International Conference on Optical Communications and Networks, 2019, pp. 1-3.

Seth Coe et al., "Electroluminescence from single monolayers of nanocrystals in molecular organic devices," Nature, Dec. 2002, pp. 800-803, vol. 420.

Soniya D. Yambem et al., "Stable organic photovoltaics using Ag thin film anodes," Journal of Materials Chemistry, Feb. 28, 2012, pp. 6894-6898, vol. 22.

Tae-Ho Kim et al., "Full-colour quantum dot displays fabricated by transfer printing," Nature Photonics, Feb. 20, 2011, pp. 176-182, vol. 5.

Madimir V. Voytovich et al., "Study of n-alkylamine Intercalated Layered Perovskite-Like Niobates HCa2Nb3O10 as Photocatalysts for Hydrogen Production From an Aqueous Solution of Methanol," Apr. 23, 2020, pp. 1-12, vol. 8.

Office Action dated Jun. 13, 2025 of the corresponding Korean Patent Application No. 10-2021-0041430.

* cited by examiner

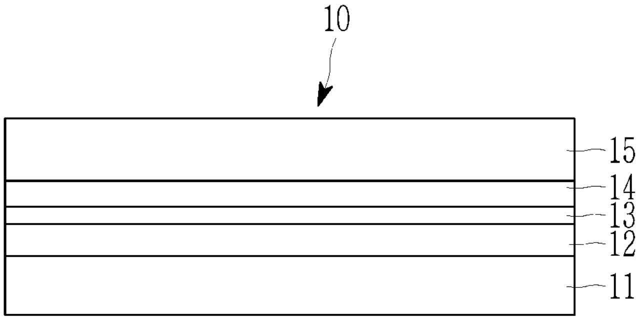
10
15
14
13
12
11

QUANTUM DOT DEVICE AND ELECTRONIC DEVICE INCLUDING THE SAME

CROSS-REFERENCE TO RELATED APPLICATION

This application claims priority to and the benefit of Korean Patent Application No. 10-2021-0041430 filed in the Korean Intellectual Property Office on Mar. 30, 2021, and all the benefits accruing therefrom under 35 U.S.C. § 119, the entire contents of which are incorporated herein by reference.

BACKGROUND

1. Field

A quantum dot device and an electronic device including the same are disclosed.

2. Description of the Related Art

Physical characteristics (e.g., bandgap energies, melting points, etc.) of nanoparticles that are known as intrinsic characteristics may be controlled, for example, by changing particle sizes of the nanoparticles, unlike bulk materials. For example, semiconductor nanocrystals also known as quantum dots are supplied with photoenergy or electrical energy and may emit light in a wavelength corresponding to sizes of the quantum dots. Accordingly, quantum dots may be used as a light emitting body emitting light of a particular wavelength.

SUMMARY

A quantum dot device including quantum dots may be used as a light emitting body. However, since quantum dots may be different from other light emitting bodies, new methods for improving the performance of quantum dot devices are desired.

An embodiment provides a quantum dot device capable of implementing high luminous efficiency.

An embodiment provides an electronic device including the quantum dot device.

According to an embodiment, a quantum dot device includes a first electrode and a second electrode, a quantum dot layer disposed between the first electrode and the second electrode, and a hole auxiliary layer disposed between the quantum dot layer and the first electrode, wherein the hole auxiliary layer includes nickel oxide, and a self-assembled monolayer disposed between the hole auxiliary layer and the quantum dot layer, the self-assembled monolayer including an organic compound represented by Chemical Formula 1.

Chemical Formula 1

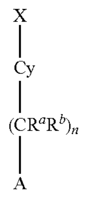

In Chemical Formula 1,

A is an anionic anchor group, $R^a$ and $R^b$ are each independently hydrogen, deuterium, a C1 to C10 alkyl group, or a C1 to C10 fluoroalkyl group, n is an integer from 0 to 3, Cy is a substituted or unsubstituted C6 to C30 aryl group, a substituted or unsubstituted C2 to C30 heteroaryl group, a substituted or unsubstituted C3 to C30 cycloalkyl group, or a substituted or unsubstituted C2 to C30 heterocycloalkyl group, and X is a hydrophobic substituted or unsubstituted C1 to C20 alkyl group or a halogen.

The compound represented by Chemical Formula 1 may include an organic compound represented by Chemical Formula 1-1.

Chemical Formula 1-1

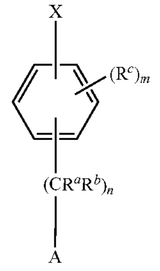

In Chemical Formula 1-1,

A is an anionic anchor group, $R^a$ and $R^b$ are each independently hydrogen, deuterium, a C1 to C10 alkyl group, or a C1 to C10 fluoroalkyl group, n is an integer from 0 to 3, $R^c$ is hydrogen, deuterium, or a C1 to C6 alkyl group, m is an integer from 1 to 4, and X is a hydrophobic substituted or unsubstituted C1 to C20 alkyl group or a halogen.

The nickel oxide may include $NiO_x$, wherein $0.5 \leq x \leq 1.5$, for example, x may be in the range of about 1.1 to 1.5.

The anionic anchor group A may be a carboxyl group, a sulfonic acid group, a phosphoric acid group, a phosphonic acid group, or a salt thereof.

The hole auxiliary layer may have a thickness of about 10 nanometers (nm) to about 100 nm.

A bandgap energy of the hole auxiliary layer may be in a range of about 3.0 electronvolts (eV) to about 5.0 eV.

An energy level of a valence band of the hole auxiliary layer may be between a work function of the first electrode and a highest occupied molecular orbital (HOMO) energy level of the quantum dot layer.

An energy level of a valence band of the hole auxiliary layer may be equal to or less than a HOMO energy level of the quantum dot layer, and a difference between the energy level of the valence band of the hole auxiliary layer and the highest occupied molecular orbital energy level of the quantum dot layer may be less than or equal to about 1.0 eV.

An energy level of a conduction band of the hole auxiliary layer may be less than a lowest unoccupied molecular orbital (LUMO) energy level of the quantum dot layer.

An energy level of a conduction band of the hole auxiliary layer may be greater than a LUMO energy level of the quantum dot layer, and a difference between the energy level of the conduction band of the hole auxiliary layer and the lowest unoccupied molecular orbital energy level of the quantum dot layer may be greater than or equal to about 0.5 eV.

A ratio of a thickness of the self-assembled monolayer to a thickness of the hole auxiliary layer 12 may be in a range of about 0.01:1 to about 0.5:1.

The quantum dot device may further include an electron auxiliary layer including inorganic nanoparticles or an organic material.

The inorganic nanoparticles may include metal oxide nanoparticles represented by $Zn_{1-x}Q_xO$, wherein Q is a metal other than Zn, and $0 \leq x < 0.5$.

The quantum dot device may include the hole auxiliary layer as a first hole auxiliary layer and may further include a second hole auxiliary layer including an organic material between the first hole auxiliary layer and the quantum dot layer.

The quantum dot layer may include a cadmium-free Group III-V semiconductor compound.

According to an embodiment, an electronic device including the quantum dot device is provided.

The quantum dot device includes an inorganic hole auxiliary layer having high hole mobility and improved electron blocking properties, and thus exhibit high efficiency.

BRIEF DESCRIPTION OF THE DRAWINGS

The above and other advantages and features of this disclosure will become more apparent by describing in further detail exemplary embodiments thereof with reference to the accompanying drawing, in which:

the FIGURE is a cross-sectional view schematically illustrating a quantum dot device according to an embodiment.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, "combination" refers to a mixture or a stacked structure of two or more.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURE. It will be understood that relative terms are intended to encompass different orientations of the device in addition to the orientation depicted in the FIGURE. For example, if the device in the FIGURE is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in the FIGURE is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used (i.e., non-technical) dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURE are schematic in nature and their shapes are not intended to illustrate the precise shape of a region and are not intended to limit the scope of the present claims.

As used herein, when a definition is not otherwise provided, "substituted" refers to replacement of hydrogen of a compound or a functional group by a substituent, such as a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, a C1 to C20 ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group (e.g., benzyl), a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, or a combination thereof.

As used herein, when a group is referred to as "substituted or unsubstituted," the total number of carbon atoms recited in a group includes any substituents. For example, a substituted or unsubstituted C6 to C7 aryl group includes phenyl and tolyl.

As used herein, when a definition is not otherwise provided, "hetero" refers to a compound or group including 1 to 3 heteroatoms, such as N, O, S, P, and Si.

As used herein, when a definition is not otherwise provided, an "alkyl group" may have a linear or branched structure. Examples of the alkyl group may include a methyl group, an ethyl group, a propyl group, a butyl group, a pentyl group, or a hexyl group.

As used herein, when a definition is not otherwise provided, "aryl group" refers to a group including a, e.g., at least one, hydrocarbon aromatic moiety. All elements of the hydrocarbon aromatic moiety have p-orbitals which form conjugation, for example a phenyl group, a tolyl group, a xylyl group, a naphthyl group, and the like; two or more hydrocarbon aromatic moieties may be linked by a sigma bond and may be, for example a biphenyl group, a terphenyl group, a quaterphenyl group, and the like; or two or more hydrocarbon aromatic moieties are fused directly or indirectly to provide a non-aromatic fused ring, for example a fluorenyl group.

The aryl group may include a monocyclic, polycyclic, or fused polycyclic (i.e., rings sharing adjacent pairs of carbon atoms) functional group.

For example, a substituted or unsubstituted C6 to C30 aryl group may refer to a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

As used herein, when a definition is not otherwise provided, a substituted or unsubstituted C3 to C30 cycloalkyl group may refer to a monocyclic ring such as a cyclobutyl group or a cyclopentyl group, a fused ring of two or more monocyclic rings, or a ring provided by linking two or more monocyclic rings by a sigma bond.

As used herein, when a definition is not otherwise provided, a substituted or unsubstituted C2 to C30 heterocycloalkyl group may refer to a substituted or unsubstituted cycloalkyl group wherein at least one ring atom is substituted by a heteroatom such as N, O, S, P, or Si, for example where 1 to 4 ring atoms are substituted by N, O, or S.

As used herein, when a definition is not otherwise provided, a substituted or unsubstituted C2 to C30 heterocycloaryl group may refer to a substituted or unsubstituted aryl group wherein at least one ring atom is substituted by a heteroatom such as N, O, S, P, or Si, for example where 1 to 4 ring atoms substituted by N, O, or S.

For example, the substituted or unsubstituted C2 to C30 heterocycloalkyl group or the substituted or unsubstituted C2 to C30 heteroaryl group may refer to a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, a substituted or unsubstituted dibenzothiophenyl group, or a combination thereof, but is not limited thereto.

Hereinafter, values of a work function, a conduction band, a valence band, a HOMO energy level, or a LUMO energy level are expressed as absolute values from a vacuum level. In addition, when the work function, conduction band, valence band, HOMO energy level, or LUMO energy level is referred to be, e.g., as, deep, high, or large the work function, conduction band, valence band, HOMO energy level, or LUMO energy level may have a large absolute value based on "0 eV" of the vacuum level, and when the work function, conduction band, valence band, HOMO energy level, or LUMO energy level is referred to be, e.g., as, shallow, low, or small, the work function, conduction band, valence band, HOMO energy level, or LUMO energy level may have a small absolute value based on "0 eV" of the vacuum level.

Hereinafter, the conduction band minimum (CBM) of the inorganic compound such as nickel oxide refers to the lowest end of the conduction band, and the valence band maximum (VBM) of the inorganic compound refers to the uppermost end of the valence band. A difference between the CBM and the VBM is referred to be, e.g., as, a bandgap.

The HOMO energy level and valence band are obtained using AC-3 equipment (Riken Keiki Co. Ltd.) by measuring a photoelectric work function of a thin film having a thickness of about 20 nm to about 30 nm, and calculating the emission energy due to the photoelectron effect for the irradiated energy by Equation 1 in the range of about 7.0 eV to about 4.0 eV.

$$E=h\cdot c/\lambda \qquad \text{Equation 1}$$

(h: plank's constant, c: light velocity, λ: wavelength)

LUMO energy level and conduction band obtained by taking, e.g., measuring, ultraviolet (UV) absorption with an ultraviolet-visible (UV-Vis) spectrophotometer using an AC-3 equipment (Riken Keiki Co. Ltd.), converting the edge wavelength at which absorption occurs to eV units to obtain an optical bandgap, and adding the obtained bandgap to the HOMO energy level and valence band.

Hereinafter, a quantum dot device according to an embodiment will be described with reference to the drawings.

The FIGURE is a cross-sectional view schematically illustrating a quantum dot device according to an embodiment.

Referring to the FIGURE, a quantum dot device 10 according to an embodiment includes a first electrode 11 and a second electrode 15 facing each other; a quantum dot layer 14 disposed between the first electrode 11 and the second electrode 15, and a hole auxiliary layer 12 disposed between the first electrode 11 and the quantum dot layer 14.

A substrate (not shown) may be disposed at the side of the first electrode 11 or at the side of the second electrode 15. The substrate may include, for example, an inorganic material such as glass; an organic material such as polycarbonate, poly(methyl methacrylate), polyethylene terephthalate, polyethylene naphthalate, polyamide, polyethersulfone, or a combination thereof; or the substrate may be made of a silicon wafer or the like. The substrate may be omitted.

One of the first electrode 11 and the second electrode 15 is an anode and the other is a cathode. For example, the first electrode 11 may be an anode and the second electrode 15 may be a cathode. For example, the first electrode 11 may be a cathode and the second electrode 15 may be an anode.

The anode may include a conductor having a high work function, for example, a metal, a conductive metal oxide, or a combination thereof. The anode may include, for example, a metal such as nickel, platinum, vanadium, chromium, copper, zinc, gold, or an alloy thereof; a conductive metal oxide such as zinc oxide, indium oxide, tin oxide, indium tin oxide (ITO), indium zinc oxide (IZO), or fluorine-doped tin oxide; or a combination of a metal such as ZnO and Al or $SnO_2$ and Sb and an oxide, but is not limited thereto.

The cathode may include a conductor having a lower, e.g., lesser, work function than the anode, and may include, for example, a metal, a conductive metal oxide, a conductive polymer, or a combination thereof. The cathode may include, for example, a metal such as aluminum, magnesium, calcium, sodium, potassium, titanium, indium, yttrium, lithium, gadolinium silver, tin, lead, cesium, barium, and the like, or an alloy thereof; a multilayered structure material such as LiF/Al, $LiO_2$/Al, 8-hydroxyquinolinato lithium (Liq)/Al, LiF/Ca, or $BaF_2$/Ca, but is not limited thereto.

A work function of the anode may be higher, e.g., greater, than a work function of the cathode, for example the work function of the anode may be, for example, about 4.5 eV to about 5.0 eV and the work function of the cathode may be about 4.0 eV to about 4.7 eV. Within this range, the work function of the anode may be, for example, about 4.6 eV to about 4.9 eV or about 4.6 eV to about 4.8 eV, and the work function of the cathode may be, for example, about 4.0 eV to about 4.6 eV or about 4.3 eV to about 4.6 eV.

The first electrode 11, the second electrode 15, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

The quantum dot layer 14 includes quantum dots. The quantum dot may be a semiconductor nanocrystal, and may have various shapes, for example an isotropic semiconductor nanocrystal, a quantum rod, and a quantum plate. Herein, the quantum rod may indicate a quantum dot having an aspect ratio of greater than about 1:1, for example, greater than or equal to about 2:1, greater than or equal to about 3:1, or greater than or equal to about 5:1. For example, the quantum rod may have an aspect ratio of less than or equal to about 50:1, less than or equal to about 40:1, less than or equal to about 30:1, or less than or equal to about 20:1.

The quantum dot may have for example a particle diameter (an average largest particle diameter for a non-spherical shape) of for example about 1 nm to about 100 nm, about 1 nm to about 80 nm, about 1 nm to about 50 nm, or about 1 nm to about 20 nm.

Bandgap energies of quantum dots may be controlled according to sizes and compositions of the quantum dots, and thus emission wavelengths may be controlled. For example, as the sizes of quantum dots increase, the quantum dots may have narrow bandgap energies and thus emit light in a relatively long wavelength region while as the sizes of the quantum dots decrease, the quantum dots may have wide bandgap energy and thus emit light in a relatively short wavelength region.

For example, the quantum dot may emit for example light in a predetermined wavelength region of a visible light region according to a size of the quantum dot composition of the quantum dot, or a combination thereof.

For example, the quantum dot may emit blue light, red light, or green light, and the blue light may have for example a peak emission wavelength ($\lambda_{max}$) in a range of about 430 nm to about 480 nm, the red light may have for example a peak emission wavelength ($\lambda_{max}$) in a range of about 600 nm to about 650 nm, and the green light may have for example a peak emission wavelength ($\lambda_{max}$) in a range of about 520 nm to about 560 nm.

For example, an average size of the quantum dot emitting blue light may be, for example, less than or equal to about 4.5 nm, less than or equal to about 4.3 nm, less than or equal to about 4.2 nm, less than or equal to about 4.1 nm, or less than or equal to about 4.0 nm. Within the disclosed range, for example, the average size of the quantum dot emitting blue light may be about 2.0 nm to about 4.5 nm, about 2.0 nm to about 4.3 nm, about 2.0 nm to about 4.2 nm, about 2.0 nm to about 4.1 nm, or about 2.0 nm to about 4.0 nm.

The quantum dot may have for example a quantum yield of greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM is a width of a wavelength corresponding to a half of a peak absorption point and as the FWHM is narrower, light in a narrower wavelength region may be emitted and high color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. Within the disclosed range, the quantum dot may have for example a FWHM of about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof, but is not limited thereto. The Group IV semiconductor compound may be for example a single element semiconductor compound such as Si, Ge, or a combination thereof; a binary element semiconductor compound such as SiC, SiGe, and a combination thereof; or a combination thereof, but is not limited thereto. The Group I-III-VI semiconductor compound may be for example $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a cadmium (Cd)-free quantum dot. The cadmium-free quantum dot is a quantum dot that does not include cadmium (Cd). Cadmium (Cd) may cause severe environment/health problems and is a restricted element by Restriction of Hazardous Substances Directive (RoHS) in a plurality of countries, and thus cadmium-free quantum dots may be effectively used.

As an example, the quantum dot may be a semiconductor compound including zinc (Zn), and one of tellurium (Te) and selenium (Se). For example, the quantum dot may be a Zn—Te semiconductor compound, a Zn—Se semiconductor compound, a Zn—Te—Se semiconductor compound, or a combination thereof. For example, an amount of tellurium (Te) in the Zn—Te—Se semiconductor compound may be smaller, e.g., less, than an amount of selenium (Se). The semiconductor compound may have a peak emission wavelength ($\lambda_{max}$) in a wavelength region of less than or equal to about 480 nm, for example, about 430 nm to about 480 nm, and may emit blue light.

For example, the quantum dot may be a semiconductor compound including indium (In), phosphorus (P) and optionally zinc (Zn). For example, the quantum dot may be an In—P semiconductor compound, an In—Zn—P semiconductor compound, or a combination thereof. For example, in the In—Zn—P semiconductor compound, a mole ratio of zinc (Zn) to indium (In) may be greater than or equal to about 25:1. The semiconductor compound may have a peak emission wavelength ($\lambda_{max}$) in a wavelength region of less than about 700 nm, for example about 600 nm to about 650 nm, and may emit red light.

The quantum dot may have a core-shell structure wherein one quantum dot surrounds another quantum dot. For example, the core and the shell of the quantum dot may have an interface, and an element of the core, the shell, or a combination thereof in the interface may have a concentration gradient wherein the concentration of the element(s) of the shell decreases in a direction toward the core. For example, a material composition of the shell of the quantum dot may have a higher, e.g., greater, bandgap energy than a material composition of the core of the quantum dot, and thereby the quantum dot may exhibit a quantum confinement effect.

The quantum dot may have one quantum dot core and a multi-layered quantum dot shell surrounding the core. Herein, the multilayered shell has at least two shells wherein each shell may be a single composition, be an alloy, have a concentration gradient, or a combination thereof.

For example, a shell of a multilayered shell that is farther from the core may have a higher, e.g., greater, bandgap energy than a shell that is near to the core, and thereby the quantum dot may exhibit a quantum confinement effect.

For example, the quantum dot having a core-shell structure may for example include a core including a first semiconductor compound including zinc (Zn) and of tellurium (Te), selenium (Se), or a combination thereof and a shell including a second semiconductor compound disposed on at least a portion of the core and having a different composition from that of the core.

For example, the first semiconductor compound may be a Zn—Te—Se-based semiconductor compound including zinc (Zn), tellurium (Te), and selenium (Se), for example, a Zn—Se-based semiconductor compound including a small amount of tellurium (Te), for example, a semiconductor compound represented by $ZnTe_xSe_{1-x}$, where x is greater than about 0 and less than or equal to 0.05.

For example, in the Zn—Te—Se-based first semiconductor compound, a mole amount of zinc (Zn) may be higher, e.g., greater, than that of selenium (Se), and a mole amount of selenium (Se) may be higher, e.g., greater, than that of tellurium (Te). For example, in the first semiconductor compound, a mole ratio of tellurium (Te) to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

The second semiconductor compound may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor compound, Group I-III-VI semiconductor compound, Group I-II-IV-VI semiconductor compound, and Group II-III-V semiconductor compound are the same as described herein.

For example, the second semiconductor compound may include zinc (Zn), selenium (Se), sulfur (S) or a combination thereof. For example, the shell may include ZnSeS, ZnSe, ZnS, or a combination thereof. For example, the shell may include a, e.g., at least one, inner shell disposed close to, e.g., directly on, the core and an outermost shell disposed at the outermost side of the quantum dot. The inner shell may include ZnSeS, ZnSe, or a combination thereof and the outermost shell may include ZnS. For example, the shell may have a concentration gradient of one component and for example an amount of sulfur (S) may increase in a direction away from the core.

For example, a quantum dot having a core-shell structure may include a core including a third semiconductor compound including indium (In) and zinc (Zn), phosphorus (P), or a combination thereof and a shell disposed on at least a portion of the core and including a fourth semiconductor compound having a composition different from the core.

In the In—Zn—P-based third semiconductor compound, a mole ratio of zinc (Zn) to indium (In) may be greater than or equal to about 25:1. For example, in the In—Zn—P-based first semiconductor compound, the mole ratio of zinc (Zn) to indium (In) may be greater than or equal to about 28:1, greater than or equal to about 29:1, or greater than or equal to about 30:1. For example, in the In—Zn—P-based first semiconductor compound, the mole ratio of zinc (Zn) to indium (In) may be less than or equal to about 55:1, less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor compound, Group I-III-VI semiconductor compound, Group I-II-IV-VI semiconductor compound, and Group II-III-V semiconductor compound are the same as described herein.

For example, the fourth semiconductor compound may include zinc (Zn) and sulfur (S) and optionally selenium (Se). For example, the shell may include ZnSeS, ZnSe, ZnS, or a combination thereof. For example, the shell may include a, e.g., at least one, inner shell disposed close to, e.g., directly on, the core and an outermost shell disposed at the outermost side of the quantum dot. The inner shell, the outermost shell, or a combination thereof may include a fourth semiconductor compound of ZnS, ZnSe, or ZnSeS.

The quantum dot layer 14 may have a thickness of, for example, about 5 nm to about 200 nm, and within the disclosed range, for example, about 10 nm to about 150 nm, about 10 nm to about 100 nm, or about 10 nm to about 50 nm.

The quantum dot layer 14 may have a relatively deep HOMO energy level, for example, a HOMO energy level of greater than or equal to about 5.4 eV, and within the disclosed range, for example greater than or equal to about 5.5 eV, greater than or equal to about 5.6 eV, greater than or equal to about 5.7 eV, about greater than or equal to about 5.8 eV, greater than or equal to about 5.9 eV, or greater than or equal to about 6.0 eV. Within the disclosed range, the HOMO energy level of the quantum dot layer 14 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, and within the disclosed range, for example, about 5.5 eV to about 7.0 eV, about 5.5 eV to about 6.8 eV, about 5.5 eV to about 6.7 eV, about 5.5 eV to about 6.5 eV, about 5.5 eV to about 6.3 eV, about 5.5 eV to about 6.2 eV, about 5.5 eV to about 6.1 eV, about 5.5 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, and within the disclosed range, for example, about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV, and within the disclosed range, for example, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV, and within the disclosed range, for example, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The quantum dot layer 14 may have a relatively shallow LUMO energy level, for example, less than or equal to about 3.6 eV, and within the disclosed range, for example, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. Within the disclosed range, the LUMO energy level of the quantum dot layer 14 may be about 2.5 eV to about 3.7 eV, about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, about 2.5 eV to about 3.0 eV, about 2.8 eV to about 3.7 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 2.5 eV to about 3.7 eV, about 3.0 eV to about 3.6 eV, about 3.0 eV to about 3.5 eV, or about 3.0 eV to about 3.4 eV.

The quantum dot layer 14 may have a bandgap energy of about 1.7 eV to about 2.3 eV or about 2.4 eV to about 2.9 eV. Within the disclosed range, for example, the quantum dot may have a bandgap energy of about 1.8 eV to about 2.2 eV or about 2.4 eV to about 2.8 eV, and within the disclosed range, for example, about 1.9 eV to about 2.1 eV, or about 2.4 eV to about 2.78 eV.

In a hole auxiliary layer of a quantum dot device, a (poly(3,4-ethylenedioxythiophene) (PEDOT):poly(styrene-sulfonate) (PSS) polymer may be used. A PEDOT:PSS polymer may have low thermal stability, and a conductivity of the PEDOT:PSS polymer may decrease when exposed to high temperatures for a long time. As the metal impurity concentration in the device increases, problems such as device deterioration, resistance non-uniformity, and non-luminous increase may occur.

Therefore, in order to ensure high thermal stability and excellent hole conductivity, an inorganic compound including nickel oxide having a specific composition is used for the hole auxiliary layer 12, and a self-assembled monolayer 13 including an organic compound of a specific structure is formed on the hole auxiliary layer 12.

The hole auxiliary layer 12 may include nickel oxide, wherein the nickel oxide may be $NiO_x$ ($0.5 \le x < 1.5$), for example, x is greater than or equal to about 0.6, greater than or equal to about 0.7, greater than or equal to about 0.8, greater than or equal to about 0.9, greater than or equal to about 1.0, greater than or equal to about 1.1, or greater than or equal to about 1.2, and less than or equal to about 1.5, or less than or equal to about 1.4. The nickel oxide having the composition ratio within the disclosed ranges provides a hole auxiliary layer 12 having improved hole transport properties and high electron blocking properties, thereby manufacturing a quantum dot device having high efficiency, high luminance, and long life-span.

The quantum dot device 10 may further include a self-assembled monolayer 13 including the organic compound represented by Chemical Formula 1 between the hole auxiliary layer 12 and the quantum dot layer 14.

Chemical Formula 1

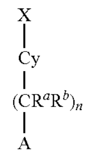

In Chemical Formula 1,

A is an anionic anchor group, $R^a$ and $R^b$ are each independently hydrogen, deuterium, a C1 to C10 alkyl group, or a C1 to C10 fluoroalkyl group, n is an integer from 0 to 3, Cy is a substituted or unsubstituted C6 to C30 aryl group, a substituted or unsubstituted C2 to C30 heteroaryl group, a substituted or unsubstituted C3 to C30 cycloalkyl group, or a substituted or unsubstituted C2 to C30 heterocycloalkyl group, and X is a hydrophobic functional group, i.e., a hydrophobic substituted or unsubstituted C1 to C20 alkyl group, or a halogen.

The organic compound represented by Chemical Formula 1 may be an organic compound represented by Chemical Formula 1-1.

Chemical Formula 1-1

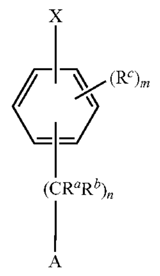

In Chemical Formula 1-1,

A is an anionic anchor group, $R^a$ and $R^b$ are each independently hydrogen, deuterium, a C1 to C10 alkyl group, or a C1 to C10 fluoroalkyl group, n is an integer from 0 to 3, $R^c$ is hydrogen, deuterium or C1 to C6 alkyl group, m is an integer from 1 to 4, and X is a hydrophobic substituted or unsubstituted C1 to C20 alkyl group, or a halogen.

Optionally in Chemical Formula 1-1, a, e.g., at least one, CH of the benzene ring may be replaced by N.

The anionic anchor group (A) may provide a negative ion (an anion) and may include a carboxyl group, a sulfonic acid group, a phosphoric acid group, a phosphonic acid group, or a salt thereof, and is not particularly limited as long as it can provide a negative ion. The salts thereof may be represented by $-C(=O)OM$, $-SO_3M$, $-PO_3MH$, or $-PO_3M_2$, wherein the alkali metal M may be an organic cation or an inorganic cation, for example, a monovalent metal (Li, Na, K, etc.). The anionic anchor group (A) may be bonded to or otherwise associated with the nickel metal of the nickel oxide of the hole auxiliary layer 13.

X may be a hydrophobic group. In particular, X may be a hydrophobic substituted or unsubstituted C1 to C20 alkyl group, for example a hydrophobic substituted or unsubstituted C1 to C10 alkyl group, for example a C1 to C20 fluoroalkyl group or a C1 to C20 perfluoroalkyl group; or X may be a halogen, for example F or Cl.

As is known in the art, an unsubstituted alkyl group may be relatively hydrophobic, as are halogens such as F or Cl. When the alkyl group is substituted, any substituent is selected so as to maintain the hydrophobicity of the alkyl group. Suitable substituents are hydrophobic or hydroneutral, and may include a halogen atom (F, Br, Cl, or I), a nitro group, a cyano group, an azido group, an amidino group, a hydrazino group, a hydrazono group, a carbonyl group, a carbamyl group, a thiol group, a C1 to C20 ester group, a C1 to C20 alkoxy group, a C2 to C20 alkenyl group, a C2 to C20 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, or a combination thereof. In as embodiment, suitable substituents for the alkyl group may include a halogen atom (F, Br, Cl, or I), a cyano group, a carbonyl group, a C1 to C20 ester group, a C1 to C20 alkoxy group, a C2 to C20 alkenyl group, a C2 to C20 alkynyl group, a C6 to C30 aryl group, a C7 to C30 arylalkyl group, a C3 to C30 cycloalkyl group, a C3 to C15 cycloalkenyl group, a C6 to C15 cycloalkynyl group, or a combination thereof.

The X group may improve coatability of the (organic) material to be coated thereon, and modify a surface characteristic of the self-assembled monolayer 13 to be hydrophobic, thereby reducing an interfacial resistance, e.g., incompatibility, with the upper layer.

The organic compound represented by Chemical Formula 1 may be an organic compound represented by Chemical Formula 1-1a.

Chemical Formula 1-1a

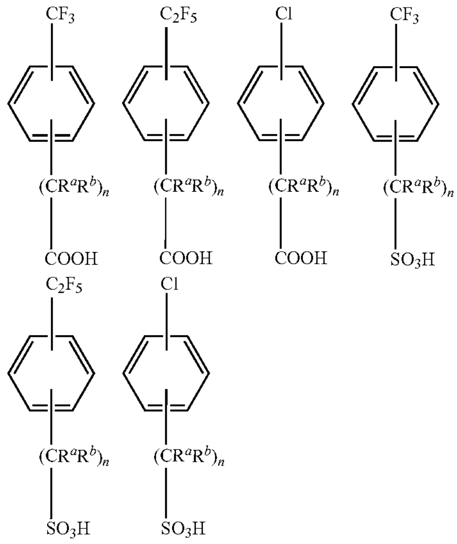

In Chemical Formula 1-1a, $R^a$ and $R^b$ are each independently hydrogen, deuterium, a C1 to C10 alkyl group, or a C1 to C10 fluoroalkyl group, n is an integer from 0 to 3, and a, e.g., at least one, hydrogen of the benzene ring may be replaced by deuterium or a C1 to C6 alkyl group.

In Chemical Formula 1-1a, a, e.g., at least one, CH of the benzene ring may be replaced by N.

In Chemical Formula 1-1a, although a carboxyl group and a sulfonic acid group are exemplified as the anionic anchor group (A), a phosphoric acid group, a phosphonic acid group, or a salt thereof may be also exemplified in the same manner.

In Chemical Formula 1-1a, $CF_3$, $C_2F_5$, Cl, etc., are exemplified as X, but other hydrophobic functional groups may be also exemplified in the same manner.

The self-assembled monolayer 13 may improve coatability of (organic) materials coated thereon, may control an energy level of the hole auxiliary layer 12, and may improve hole mobility of the hole auxiliary layer 12, thereby improving efficiency (e.g., external quantum efficiency) of the quantum dot device 10. For example, the quantum dot device 10 including the hole auxiliary layer 12 that includes nickel oxide and the self-assembled monolayer 13 that includes the organic compound of Chemical Formula 1 may exhibit an increase in efficiency of greater than or equal to about 20% compared to a quantum dot device including a PEDOT:PSS hole auxiliary layer.

The bandgap energy of the hole auxiliary layer 12 may be greater than or equal to about 3.0 eV, greater than or equal to about 3.1 eV, greater than or equal to about 3.2 eV, or greater than or equal to about 3.3 eV and less than or equal to about 5.0 eV, less than or equal to about 4.9 eV, less than or equal to about 4.8 eV, less than or equal to about 4.7 eV, less than or equal to about 4.6 eV, less than or equal to about 4.5 eV, less than or equal to about 4.4 eV, or less than or equal to about 3.3 eV. When the bandgap energy of the hole auxiliary layer 12 is in the disclosed ranges, high electron blocking properties of the hole auxiliary layer 12 may be secured.

The valence band, e.g., an energy level of the valence band, of the hole auxiliary layer 12 may be present between the work function of the first electrode 11 and the HOMO energy level of the quantum dot layer 14. For example, the work function of the first electrode 11, the valence band of the hole auxiliary layer 12, and the HOMO energy level of the quantum dot layer 14 may gradually deepen, e.g., may have increasing values, and for example, may have a stepped shape.

The hole auxiliary layer 12 may have a relatively deep valence band, e.g., an energy level of the valence band of the hole auxiliary layer 12 may be relatively large, to match the HOMO energy level of the quantum dot layer 14. Accordingly, the mobility of holes transferred from the hole auxiliary layer 12 to the quantum dot layer 14 may be increased.

The valence band, e.g., an energy level of the valence band, of the hole auxiliary layer 12 may be less than or equal to the HOMO energy level of the quantum dot layer 14 within a range of less than or equal to about 1.0 eV. Stated otherwise, an energy level of a valence band of the hole auxiliary layer 12 may be equal to or less than a HOMO energy level of the quantum dot layer 14, and a difference between the energy level of the valence band of the hole auxiliary layer 12 and the HOMO energy level of the quantum dot layer 14 may be less than or equal to about 1.0 eV. For example, the difference between (an energy level of) the valence band of the hole auxiliary layer 12 and the HOMO energy level of the quantum dot layer 14 may be about 0 eV to about 1.0 eV, and within the disclosed range, for example, about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The (energy level of the) valence band of the hole auxiliary layer 12 may be, for example greater than or equal to about 4.9 eV, greater than or equal to about 4.95 eV, greater than or equal to about 5.0 eV, or greater than or equal to about 5.1 eV. For example, the valence band of the hole auxiliary layer 12 may be about 4.9 eV to about 7.0 eV, about 4.9 eV to about 6.8 eV, about 4.9 eV to about 6.8 eV, about 4.9 eV to about 6.7 eV, about 4.9 eV to about 6.5 eV, about 4.9 eV to about 6.3 eV, about 4.9 eV to about 6.2 eV, about 4.9 eV to about 6.1 eV, about 5.0 eV to about 6.8 eV, about 5.0 eV to about 6.8 eV, about 5.0 eV to about 6.7 eV, about 5.0 eV to about 6.5 eV, about 5.0 eV to about 6.3 eV, about 5.0 eV to about 6.2 eV, or about 5.0 eV to about 6.1 eV.

The hole auxiliary layer 12 may have a conduction band shallower than the LUMO energy level of the quantum dot layer 14, e.g., an energy level of a conduction band of the hole auxiliary layer 12 may be less than the LUMO energy level of the quantum dot layer 14. Accordingly, the mobility of electrons transferred from the second electrode 15 to the quantum dot layer 14 may be blocked.

The (energy level of the) conduction band of the hole auxiliary layer 12 may be, for example, less than or equal to about 2.3 eV, less than or equal to about 2.2 eV, less than or equal to about 2.1 eV, less than or equal to about 2.0 eV, less than or equal to about 1.9 eV, or less than or equal to about 1.8 eV.

The (energy level of the) conduction band of the hole auxiliary layer 12 may be greater than the LUMO energy level of the quantum dot layer 14, by greater than or equal to about 0.5 eV, for example, greater than or equal to about 0.6 eV, greater than or equal to about 0.7 eV, greater than or equal to about 0.8 eV, greater than or equal to about 0.9 eV, greater than or equal to about 1.0 eV, greater than or equal to about 1.1 eV, greater than or equal to about 1.2 eV, greater than or equal to about 1.3 eV, greater than or equal to about 1.4 eV, or greater than or equal to about 1.5 eV. For example, a difference between the (energy level of the) conduction band of the hole auxiliary layer 12 and the LUMO energy level of the quantum dot layer 14 may be less than or equal to about 2.0 eV, less than or equal to about 1.9 eV, less than or equal to about 1.8 eV, less than or equal to about 1.7 eV, or less than or equal to about 1.6 eV.

The hole auxiliary layer 12 may have a thickness of greater than or equal to about 10 nm, for example greater than or equal to about 15 nm, greater than or equal to about 20 nm, or greater than or equal to about 25 nm and less than or equal to about 100 nm, for example less than or equal to about 95 nm, less than or equal to about 90 nm, or less than or equal to about 85 nm. In the disclosed ranges, hole mobility of the hole auxiliary layer 12 may be easily controlled.

The thickness T1 of the self-assembled monolayer 13 may be formed in a predetermined ratio with respect to the thickness T2 of the hole auxiliary layer 12, and the thickness ratio of T1:T2 may be greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, or greater than or equal to about 0.1:1 and less than or equal to about 0.50:1, less than or equal to about 0.49:1, less than or equal to about 0.48:1, less than or equal to about 0.47:1, less than or equal to about 0.46:1, less than or equal to about 0.45:1, less than or equal to about 0.44:1, less than or equal to about 0.43:1, less than or equal to about 0.42:1, less than or equal to about 0.40:1, less than or equal to about 0.39:1, less than or equal to about 0.38:1, less than or equal to about 0.37:1, less than or equal to about 0.36:1, or less than or equal to about 0.35:1. When the ratio T1:T2 of the thickness T1 of the self-assembled monolayer 13 to the thickness T2 of the hole auxiliary layer 12 is within the disclosed ranges, hole mobility of the hole auxiliary layer 12 may be increased.

The hole auxiliary layer 12 and the self-assembled monolayer 13 may have a structure of two or more layers.

The quantum dot device 10 may further include an electron auxiliary layer (electron injection layer, not shown) including inorganic nanoparticles or an organic material between the quantum dot layer 14 and the second electrode 15.

The inorganic nanoparticles may be two-dimensional or three-dimensional nanoparticles having an average particle diameter of less than or equal to about 10 nm, and within the disclosed range, less than or equal to about 9 nm, less than or equal to about 8 nm, less than or equal to about 7 nm, less than or equal to about 5 nm, less than or equal to about 4 nm, or less than or equal to about 3.5 nm, and within the disclosed range, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

For example, the inorganic nanoparticles may be hydrophilic metal oxide nanoparticles dispersible in a polar dispersion medium, wherein the polar dispersion medium may include, for example, water; alcohols such as methanol, ethanol, propanol, and butanol; or a combination thereof.

The inorganic nanoparticles may include metal oxide nanoparticles represented by $Zn_{1-x}Q_xO$, wherein Q is a, e.g., at least one, metal other than Zn, and $0 \leq x < 0.5$.

The Q may include Mg, Ce, Co, Ni, Ga, Al, Ca, Zr, W, Li, Ti, Ta, Sn, Hf, Si, Ba, or a combination thereof.

Specific examples of the inorganic nanoparticles may be an oxide of $TiO_2$, $CeO_2$, $SnO_2$, MgO, $ZrO_2$, $WO_3$, $Al_2O_3$, or a combination thereof, but is not limited thereto.

The organic material included in the electron auxiliary layer (electron injection layer) may include 1,4,5,8-naphthalene-tetracarboxylic dianhydride (NTCDA), bathocuproine (BCP), tris[3-(3-pyridyl)-mesityl]borane (3TPYMB), LiF, tris-(8-hydroxyquinolinato)aluminum ($Alq_3$), tris(8-hydroxyquinolinato)gallium ($Gaq_3$), tris-(8-hydroxyquinolinato)indium ($Inq_3$), bis-(8-hydroxyquinolinato)zinc ($Znq_2$), bis(2-(2-hydroxyphenyl)benzothiazolate)zinc ($Zn(BTZ)_2$), bis(10-hydroxybenzo[h]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

The electron auxiliary layer (electron injection layer) may have a structure of two or more layers.

The LUMO energy level of the electron auxiliary layer (electron injection layer) may have a value between the work function of the second electrode 15 and the LUMO energy level of the quantum dot layer 14. For example, the LUMO energy levels of the second electrode 15, the electron auxiliary layer (electron injection layer), and the quantum dot layer 14 may become sequentially shallow, e.g., may have decreasing values. For example, the LUMO energy level of the electron auxiliary layer (electron injection layer) may be shallower, e.g., less, than the work function of the second electrode 15, and the LUMO energy level of the quantum dot layer 14 may be shallower, e.g., less, than the LUMO energy level of the electron auxiliary layer (electron injection layer). That is, the work function of the second electrode 15, the LUMO energy level of the electron auxiliary layer (electron injection layer), and the LUMO energy level of the quantum dot layer 14 may be sequentially shallower, e.g., may have decreasing values, along one direction (cascading energy level).

For example, the difference between the work function of the second electrode 15 and the LUMO energy level of the electron auxiliary layer (electron injection layer) may be less than about 0.5 eV, about 0.001 eV to about 0.5 eV, about 0.001 eV to about 0.4 eV, or about 0.001 eV to about 0.3 eV. For example, the difference between the LUMO energy level of the electron auxiliary layer (electron injection layer) and the LUMO energy level of the quantum dot layer 14 may be less than about 0.5 eV, about 0.001 eV to about 0.5 eV, about 0.001 eV to about 0.4 eV, or about 0.001 eV to about 0.3 eV. Accordingly, a driving voltage of the quantum dot device 10 may be lowered by facilitating the injection of electrons from the second electrode 15 to the electron auxiliary layer (electron injection layer), and from the electron auxiliary layer (electron injection layer) to the quantum dot layer 14, and the efficiency may be increased by effectively transferring electrons. The LUMO energy level of the electron auxiliary layer (electron injection layer) may be within a range satisfying the disclosed energy level, for example, about 3.4 eV to about 4.8 eV, about 3.4 eV to about 4.6 eV, about 3.4 eV to about 4.5 eV, about 3.6 eV to about 4.8 eV, about 3.6 eV to about 4.6 eV, about 3.6 eV to about 4.5 eV, about 3.6 eV to about 4.3 eV, about 3.9 eV to about 4.8 eV, about 3.9 eV to about 4.6 eV, about 3.9 eV to about 4.5 eV, or about 3.9 eV to about 4.3 eV.

In the quantum dot device 10, the hole auxiliary layer 12 may be a first hole auxiliary layer and a second hole auxiliary layer including an organic or inorganic material may be further included between the first electrode 11 and the first hole transport layer 12.

The organic or inorganic material included in the second hole transport layer may include poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly(N-vinylcarbazole) (PVK), polyaniline, polypyrrole, N,N,N',N'-tetrakis (4-methoxyphenyl)-benzidine (TPD), N,N'-bis(naphthalen-1-yl)-N,N'-bis (phenyl)-2,2'-dimethylbenzidine (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

The quantum dot device 10 having the aforementioned configuration may exhibit excellent efficiency.

In the method of manufacturing the quantum dot device 10, the first electrode 11 is formed on a substrate (not shown), and nickel oxide is deposited or a solution-coated on the first electrode 11 to form the hole auxiliary layer 12, and a self-assembled monolayer 13 including the organic compound represented by Chemical Formula 1 is formed on the hole auxiliary layer 12, a quantum dot layer 14 is formed on the self-assembled monolayer 13, and a second electrode is formed on the quantum dot layer 14.

When the hole auxiliary layer 12 is formed, the solution-coating may include a process of coating a composition in which a nickel-containing precursor is dissolved in a solvent, for example, spin coating, slit coating, inkjet printing, nozzle printing, spraying, doctor blade coating, or a combination thereof, but is not limited thereto. The nickel-containing precursor may be a nickel salt such as nickel sulfate, nickel chloride, nickel nitrate, or a hydrate thereof, and the solvent may be an alcohol.

After the solution-coating, for example, an annealing process may be performed at about 50° C. to about 400° C., for example, at about 70° C. to about 400° C. for about 1 minute to about 10 hours. The annealing process may include a low-temperature annealing process of about 50° C. to about 150° C. and a high-temperature annealing process of about 200° C. to about 400° C., and the low-temperature annealing process and the high-temperature annealing process may be sequentially performed.

The self-assembled monolayer 13 may be formed by coating a composition obtained by dissolving the organic compound represented by Chemical Formula 1 in a solvent and then annealing. The solvent may include, for example, water; alcohols such as methanol, ethanol, propanol, or butanol; or a combination thereof, but is not limited thereto. The annealing process may be performed, for example, at about 50° C. to about 150° C., for example, at about 70° C. to about 120° C. for about 1 minute to about 30 minutes.

Before forming the self-assembled monolayer 13, the hole auxiliary layer 12 may be surface-treated with ultraviolet (UV)-ozone so that the surface of the hole auxiliary layer 12 may have hydrophilicity to be bound to the anionic anchor group (A) of the self-assembled monolayer 13.

The aforementioned quantum dot device may be applied to, e.g., used in, various light emitting electronic devices, for example, a display device such as a photodetector, a sensor (e.g., an image sensor), television (TV), a monitor, a computer, a mobile, and the like or a lighting device such as a light source and the like.

Hereinafter, the embodiments are illustrated in more detail with reference to examples. However, these examples are exemplary, and the present scope is not limited thereto.

Preparation Example 1: Preparation of Quantum Dot Dispersion

Preparation Example 1-1

(1) Preparation of ZnTeSe Core Quantum Dot Dispersion

Selenium (Se) and tellurium (Te) are respectively dispersed in trioctylphosphine (TOP) to obtain a 2 moles per liter (molar (M)) Se/TOP stock solution and a 0.1 M Te/TOP stock solution.

An amount of 0.125 mmol of zinc acetate is added with 0.25 millimoles (mmol) of oleic acid and 0.25 mmol of hexadecylamine and 10 milliliters (mL) of trioctylamine to a reactor and then, heated under vacuum at 120° C. After 1 hour, an atmosphere in the reactor is converted into nitrogen.

After heating the reactor at 240° C., the Se/TOP stock solution and the Te/TOP stock solution in a Te:Se mole ratio of 1:25 are rapidly injected thereinto. The reaction solution is heated up to 300° C., maintained for 30 minutes, and then, rapidly cooled down to room temperature, acetone is added thereto, and precipitates obtained therefrom through centrifugation are dispersed in toluene to obtain ZnTeSe core quantum dot dispersion.

(2) Preparation of ZnTeSe Core/ZnSeS Shell Quantum Dot Dispersion

In a 10 mL flask, trioctylamine is added. Subsequently, 0.6 mmol of zinc acetate and 1.2 mmol of oleic acid are added thereto and then, subjected to vacuum conditions at 120° C. for 10 minutes. Then, the flask is internally substituted with nitrogen ($N_2$), the ZnTeSe core quantum dot dispersion is rapidly injected thereinto, and the 2 M Se/TOP and the 1 M S/TOP in a Se:S mole ratio of 1.2:2.8 are injected thereinto and then, heated up to 340° C. to perform a reaction. When the reaction is complete, the reactor is cooled down, nanocrystals are centrifuged with ethanol and then, dispersed in toluene to obtain ZnTeSe core/ZnSeS shell quantum dot dispersion.

Preparation Example 1-2

(1) Preparation of InP Core Quantum Dot Dispersion

In a 200 mL reaction flask, indium acetate and palmitic acid are dissolved in 1-octadecene and then, heated at 120° C. under vacuum. Herein, indium and palmitic acid have a mole ratio of 1:3. After 1 hour, an atmosphere in the reactor is converted into nitrogen. Subsequently, after heating the reactor at 280° C., a mixed solution of tris(trimethylsilyl) phosphine (TMS3P) and trioctylphosphine is rapidly injected thereinto and then, reacted for 20 minutes. Herein, TMS3P is used in an amount of 0.5 moles per 1 mole of indium. Subsequently, acetone is added to the reaction solution cooled down to room temperature, and then, precipitates centrifuged therefrom are dispersed again in toluene to prepare InP core quantum dot dispersion. The InP core quantum dot has a particle diameter of about 3 nanometers (nm).

(2) Preparation of InP Core/ZnSe Shell/ZnS Shell Quantum Dot Dispersion

Selenium (Se) is dispersed in trioctylphosphine (TOP) to prepare a Se/TOP stock solution, and sulfur (S) is dispersed in trioctylphosphine (TOP) to prepare a S/TOP stock solution.

In a 200 mL reaction flask, zinc acetate and oleic acid are dissolved in trioctylamine and then, subjected to vacuum conditions at 120° C. for 10 minutes. Subsequently, the reaction flask is internally substituted with $N_2$ and heated up to 180° C., and then, the InP core quantum dot dispersion is added thereto.

The obtained mixture is heated up to 280° C., Se/TOP is injected thereinto and then, reacted, the obtained mixture is heated again up to 320° C., and the rest of Se/TOP is injected thereinto and then, reacted for predetermined time to form a ZnSe shell on the InP core. Subsequently, the S/TOP stock solution is added to the reaction mixture and reacted therewith for predetermined time to form a ZnS shell on the ZnSe shell to obtain an InP core/ZnSe shell/ZnS shell quantum dot. The ZnSe shell is formed for total reaction time of 60 minutes, and a total amount of Se is about 20 moles based on 1 mole of indium, and the ZnS shell is also formed for total reaction time of 60 minutes, and a total amount of S is about 10 moles based on 1 mole of indium.

The obtained InP core/ZnSe shell/ZnS shell quantum dot is added to an excessive amount of ethanol and then, centrifuged. After the centrifugation, a supernatant is poured out, and precipitates therefrom are dried and dispersed in chloroform or toluene to obtain InP core/ZnSe shell/ZnS shell quantum dot dispersion.

Example 1: Manufacture of Hole Only Device (HOD)

Nickel nitrate hexahydrate (2.908 grams (g)) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:8 and stirred for 2 minutes to prepare a composition for forming a hole auxiliary layer.

After surface-treating a glass substrate deposited with indium tin oxide (ITO) (work function: −4.8 electronvolts (eV)) as a first electrode (anode) with UV-ozone for 40 minutes, the composition for forming a hole auxiliary layer is spin-coated thereon for 30 seconds (s) at 3,000 revolutions per minute (rpm) to form a 35 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a hole auxiliary layer ($NiO_x$ thin film, $1.1 \le x \le 1.5$).

An amount of 10 mg of 4-(trifluoromethyl)benzoic acid is mixed with 4 mL of ethanol, preparing a self-assembled monolayer (SAM) solution. After coating the SAM solution on the hole auxiliary layer, allowing the SAM solution on the hole auxiliary layer to stand for 30 seconds, removing the uncoated solution by rotating a spin-coater at 5,000 rpm, and applying ethanol thereon, the spin coater is rotated again at 5,000 rpm to remove the unreacted SAM material. Subsequently, drying on a 100° C. hot plate for 7 minutes is performed, forming an about 1 nm-thick self-assembled monolayer.

Then, an electron blocking layer is formed thereon by depositing $MoO_3$ to be 10 nm thick, and consecutively, an Ag electrode is deposited to be 120 nm thick, manufacturing an HOD device.

The HOD structure has ITO (150 nm)/hole auxiliary layer (35 nm)/SAM (1 nm)/$MoO_3$ (10 nm)/Ag (120 nm).

Example 2: Manufacture of Hole Only Device (HOD)

An HOD device is manufactured in the same manner as Example 1 except that the self-assembled monolayer is formed by using 4-(chloro)benzoic acid instead of the 4-(trifluoromethyl)benzoic acid.

The HOD structure has ITO (150 nm)/hole auxiliary layer (35 nm)/SAM (1 nm)/$MoO_3$ (10 nm)/Ag (120 nm).

Comparative Example 1: Manufacture of Hole Only Device (HOD)

Nickel nitrate hexahydrate (2.908 g) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:8 and stirred for 2 minutes to prepare a composition for forming a hole auxiliary layer.

After surface-treating a glass substrate deposited with ITO (work function: −4.8 eV) as a first electrode (anode) with UV-ozone for 40 minutes, the composition for forming a hole auxiliary layer is spin-coated thereon for 30 s at 3,000 rpm to form a 35 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a hole auxiliary layer ($NiO_x$ thin film, $1.1 \le x \le 1.5$).

On the hole auxiliary layer, an electron blocking layer is formed by depositing $MoO_3$ to be 10 nm thick, and consecutively, an Ag electrode is deposited to be 120 nm thick, manufacturing an HOD device.

The HOD structure has ITO (150 nm)/hole auxiliary layer (35 nm)/$MoO_3$ (10 nm)/Ag (120 nm).

Comparative Example 2: Manufacture of Hole Only Device (HOD)

Nickel nitrate hexahydrate (2.908 g) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:8 and stirred for 2 minutes to prepare a composition for forming a hole auxiliary layer.

After surface-treating a glass substrate deposited with ITO (work function: −4.8 eV) as a first electrode (anode) with UV-ozone for 40 minutes, the composition for forming a hole auxiliary layer is spin-coated for 30 s at 3,000 rpm to form a 35 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a hole auxiliary layer ($NiO_x$ thin film, $1.1 \leq x \leq 1.5$).

On the first hole auxiliary layer, a poly(3,4-ethylenedioxythiophene):poly(styrenesulfonate) (PEDOT:PSS) polymer solution is coated and allowed to stand for 30 seconds, and the spin coater is rotated at 5,000 rpm to remove the unreacted solution. Subsequently, drying on a 100° C. hot plate for 10 minutes is performed, forming an about 30 nm-thick second hole auxiliary layer.

Then, an electron blocking layer is formed thereon by depositing $MoO_3$ to be 10 nm thick, and consecutively, an Ag electrode is deposited to be 120 nm thick, manufacturing an HOD device.

The HOD structure has ITO (150 nm)/first hole auxiliary layer (35 nm)/second hole auxiliary layer (PEDOT:PSS, 30 nm)/$MoO_3$ (10 nm)/Ag (120 nm).

Example 3: Manufacture of Hole Only Device (HOD)

Nickel nitrate hexahydrate (2.908 g) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:8 and stirred for 2 minutes to prepare a composition for forming a hole auxiliary layer.

After surface-treating a glass substrate deposited with ITO (work function: −4.8 eV) as a first electrode (anode) with UV-ozone for 40 minutes, the composition for forming a hole auxiliary layer is spin-coated thereon for 30 s at 3,000 rpm to form a 20 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a first hole auxiliary layer ($NiO_x$ thin film, $1.1 \leq x \leq 1.5$).

An amount of 10 mg of 4-(trifluoromethyl)benzoic acid is mixed with 4 mL of ethanol, preparing an SAM solution. After coating the SAM solution on the hole auxiliary layer, allowing the SAM solution on the hole auxiliary layer to stand for 30 seconds, removing the uncoated solution by rotating a spin-coater at 5,000 rpm, and applying ethanol thereon, the spin coater is rotated at 5,000 rpm to remove the unreacted SAM material. Subsequently, drying on a 100° C. hot plate for 7 minutes is performed, forming an about 1 nm-thick self-assembled monolayer.

On the self-assembled monolayer, poly(9,9-dioctylfluorene-alt-N-(4-sec-butylphenyl)-diphenylamine) (TFB) is spin-coated to form a 25 nm-thick second hole auxiliary layer.

On the second hole auxiliary layer, an electron blocking layer is formed by depositing $Zn_{0.85}Mg_{0.15}O$ to be 80 nm thick, and consecutively, an Ag electrode is deposited thereon to be 120 nm thick, manufacturing an HOD device.

The HOD structure has ITO (150 nm)/first hole auxiliary layer (20 nm)/SAM (1 nm)/second hole auxiliary layer (TFB, 25 nm)/$Zn_{0.85}Mg_{0.15}O$ (80 nm)/Ag (120 nm).

Comparative Example 3: Manufacture of Hole Only Device (HOD)

Nickel nitrate hexahydrate (2.908 g) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:16 and stirred for 2 minutes to prepare a composition for forming a hole auxiliary layer.

After surface-treating a glass substrate deposited with ITO (work function: −4.8 eV) as a first electrode (anode) with UV-ozone for 40 minutes, the composition for forming a hole auxiliary layer is spin-coated for 30 s at 3,000 rpm to form a 20 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a first hole auxiliary layer ($NiO_x$ thin film, $1.1 \leq x \leq 1.5$).

On the first hole auxiliary layer, TFB (poly(9,9-dioctylfluorene-alt-N-(4-sec-butylphenyl)-diphenylamine)) is spin-coated to form a 25 nm-thick second hole auxiliary layer.

On the second hole auxiliary layer, an electron blocking layer is formed by depositing $Zn_{0.85}Mg_{0.15}O$ to be 80 nm thick, and consecutively, an Ag electrode is deposited thereon to be 120 nm thick, manufacturing an HOD device.

The HOD structure has ITO (150 nm)/first hole auxiliary layer (20 nm)/second hole auxiliary layer (TFB, 25 nm)/$Zn_{0.85}Mg_{0.15}O$ (80 nm)/Ag (120 nm).

Comparative Example 4: Manufacture of Hole Only Device (HOD)

Nickel nitrate hexahydrate (2.908 g) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:16 and stirred for 2 minutes to prepare a composition for forming a hole auxiliary layer.

After surface-treating a glass substrate deposited with ITO (work function: −4.8 eV) as a first electrode (anode) with UV-ozone for 40 minutes, the composition for forming a hole auxiliary layer is spin-coated for 30 s at 3,000 rpm to form a 20 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a first hole auxiliary layer ($NiO_x$ thin film, $1.1 \leq x \leq 1.5$).

An amount of 10 mg of phenyl triethoxysilane is mixed with 4 mL of ethanol, preparing a SAM solution. After coating the SAM solution on the hole auxiliary layer, allowing the SAM solution on the hole auxiliary layer to stand for 30 seconds, removing the uncoated solution by rotating a spin-coater at 5,000 rpm, and applying ethanol thereon, the spin coater is rotated again at 5,000 rpm to remove the unreacted SAM material. Subsequently, drying on a 100° C. hot plate for 7 minutes is performed, forming an about 1 nm-thick self-assembled monolayer.

On the self-assembled monolayer, TFB (poly(9,9-dioctylfluorene-alt-N-(4-sec-butylphenyl)-diphenylamine)) is spin coated to form a 25 nm-thick second hole auxiliary layer.

On the second hole auxiliary layer, an electron blocking layer is formed by depositing $Zn_{0.85}Mg_{0.15}O$ to be 80 nm thick, and consecutively, an Ag electrode is deposited thereon to be 120 nm thick, manufacturing an HOD device.

The HOD structure has ITO (150 nm)/first hole auxiliary layer (20 nm)/SAM (1 nm)/second hole auxiliary layer (TFB, 25 nm)/$Zn_{0.85}Mg_{0.15}O$ (80 nm)/Ag (120 nm).

Example 4: Manufacture of Quantum Dot Device

Nickel nitrate hexahydrate (2.908 g) is dissolved in a cosolvent of 1.7 mL of ethylene glycol and 0.6 mL of ethylenediamine and then, stirred for 2 weeks in the air, preparing a solution. The solution and a 2-methoxyethanol solvent are mixed in a volume ratio of 1:8 and stirred for 2 minutes to prepare a composition for forming a hole auxiliary layer.

After surface-treating a glass substrate deposited with ITO (work function: –4.8 eV) as a first electrode (anode) with UV-ozone for 40 minutes, the composition for forming a hole auxiliary layer is spin-coated thereon for 30 s at 3,000 rpm to form a 35 nm-thick thin film. The coated thin film is primarily annealed on a 150° C. hot plate for 10 minutes and then, secondarily annealed at 330° C. for 1 h to form a $NiO_x$ thin film and then, surface-treated with UV-ozone, forming a hole auxiliary layer ($NiO_x$ thin film, $1.1 \leq x \leq 1.5$).

On the other hand, 10 mg of 4-(trifluoromethyl)benzoic acid is mixed with 4 mL of ethanol, preparing an SAM solution. After coating the SAM solution on the hole auxiliary layer, allowing the SAM solution on the hole auxiliary layer to stand for 30 seconds, removing the uncoated solution by rotating a spin-coater at 5,000 rpm, and applying ethanol thereon, the spin coater is rotated again at 5,000 rpm to remove the unreacted SAM material. Subsequently, drying on a 100° C. hot plate for 7 minutes is performed, forming an about 1 nm-thick self-assembled monolayer.

Subsequently, InP/ZnSe/ZnS core-shell-shell red quantum dots (average particle diameter: 12 nm, peak wavelength: about 630 nm, highest occupied molecular orbital (HOMO) energy level: −5.5 eV, lowest unoccupied molecular orbital (LUMO) energy level: −3.6 eV) with oleate attached as a hydrophobic ligand on the surfaces are added to octane and then, stirred for 5 minutes, preparing a composition for a red emission layer. The composition for a red emission layer is spin-coated on the second hole transport layer and heat-treated at 150° C. for 30 minutes under a nitrogen atmosphere to form a 20 nm-thick red emission layer (quantum dot layer).

On the red emission layer, a solution for an electron transport layer in which 100 parts by weight of the prepared $Zn_{0.85}Mg_{0.15}O$ (average particle diameter: 3 nm, HOMO energy level: −7.7 eV, LUMO energy level: –4.3 eV) and 100 parts by weight of tetraethyl orthosilicate (TEOS) are dispersed in ethanol is spin-coated and then, heat-treated at 80° C. for 30 minutes, forming a 20 nm-thick electron transport layer. Mg15%-ZMO ($Zn_{0.85}Mg_{0.15}O$) is prepared by dissolving 3.06 mmol of zinc acetate dihydrate, 0.54 mmol of magnesium acetate tetrahydrate, and 30 mL of dimethyl sulfoxide in a reactor. Subsequently, 5.5 mmol of tetramethylammonium hydroxide pentahydrate (TMAH) is dissolved in 10 mL of ethanol and then, added to the reactor. After stirring the obtained mixture at room temperature (25° C.) for 1 hour, the prepared $Zn_{0.85}Mg_{0.15}O$ nanoparticles and ethyl acetate are centrifuged in a volume ratio of 1:4 and dispersed in ethanol, obtaining a solution for an electron transport layer including the $Zn_{0.85}Mg_{0.15}O$ nanoparticles (average particle diameter: about 3 nm).

On the electron transport layer, aluminum (work function: –4.3 eV) is vacuum-deposited to form a 100 nm-thick upper electrode, manufacturing a light emitting device (quantum dot device) of Example 3.

Example 5: Manufacture of Quantum Dot Device

An HOD device is manufactured in the same manner as Example 4 except that the self-assembled monolayer is formed by using 4-(chloro)benzoic acid instead of the 4-(trifluoromethyl)benzoic acid.

Evaluation 1: Current Density

The HOD devices according to Examples 1 and 2 and Comparative Examples 1 and 2 are measured with respect to current density, which is measured by using an M7000 QD-LED J-V-L test system equipment (Mcscience Inc.). The results are shown in Table 1.

TABLE 1

| | Current density (J) @ 3 volts (V) (milliamperes per square centimeter (mA/cm²)) |
|---|---|
| Example 1 | 2.6 |
| Example 2 | 0.71 |
| Comparative Example 1 | $7.7 \times 10^{-3}$ |
| Comparative Example 2 | 0.26 |

Referring to Table 1, the HOD devices of Examples 1 and 2 exhibit high current density compared with the HOD devices of Comparative Examples 1 and 2.

When the current density is high, mobility also turns out to be high according to Equation 2 (Mott Gurney Law). Accordingly, the HOD devices according to Examples 1 and 2 exhibit excellent hole mobility, compared with the HOD devices according to Comparative Examples 1 and 2.

$$J = \frac{9}{8}\varepsilon\mu\frac{V_a^2}{L^3}\left(J \propto V_a^2\right) \quad \text{Equation 2}$$

In Equation 2, J indicates current density, ε (epsilon) indicates a dielectric constant, μ (mu) indicates mobility, Va indicates a voltage applied thereto, and L indicates a thickness of a hole auxiliary layer (a thickness sum of the first hole auxiliary layer and the second hole auxiliary layer of Comparative Example 2).

Evaluation 2: Driving Voltage

The HOD devices according to Examples 1 and 2 and Comparative Examples 1 and 2 are measured with respect to driving voltages by using an M7000 QD-LED J-V-L test system equipment (Mcscience Inc.), and the results are shown in Table 2.

TABLE 2

| | Voltage @ 100 candelas per square meter ($cd/m^2$) (V) |
|---|---|
| Example 1 | 2.4 |
| Example 2 | 2.9 |
| Comparative Example 1 | 5.1 |
| Comparative Example 2 | 3.5 |

Referring to Table 2, the HOD devices of Examples 1 and 2 exhibit a low driving voltage, compared with the HOD devices of Comparative Examples 1 and 2.

In addition, the HOD devices of Example 3 and Comparative Examples 3 and 4 are measured with respect to driving voltages, and the results are shown in Table 3.

TABLE 3

| | Voltage @ 5 milliamperes (mA) (V) | Voltage @ 1,000 nit ($cd/m^2$) (V) |
|---|---|---|
| Example 3 | 5.6 | 6.1 |
| Comparative Example 3 | 7.4 | 10.1 |
| Comparative Example 4 | 5.9 | 6.6 |

Referring to Table 3, the HOD device of Example 3 exhibits a low driving voltage, compared with the HOD devices of Comparative Examples 3 and 4.

Evaluation 3: Luminance and External Quantum Efficiency

The HOD devices of Examples 1 and 2 and Comparative Example 1 are evaluated with respect to maximum luminance ($L_{max}$) and maximum external quantum efficiency ($EQE_{max}$), and the results are shown in Table 4. The luminance ($L_{max}$) and the external quantum efficiency ($EQE_{max}$) are measured by using an M7000 QD-LED I-V-L test system equipment (Mcscience Inc.).

TABLE 4

| | $L_{max}$ ($cd/m^2$) @ voltage | $EQE_{max}$ (%) @ voltage |
|---|---|---|
| Example 1 | 83,000 (12.0 V) | 23.7 (3.0 V) |
| Example 2 | 41,000 (12.0 V) | 18.6 (3.5 V) |
| Comparative Example 1 | 16,000 (16.0 V) | 3.6 (6.0 V) |

Referring to Table 4, the HOD devices of Examples 1 and 2 exhibit excellent luminance ($L_{max}$) and external quantum efficiency ($EQE_{max}$), compared with the HOD device of Comparative Example 1.

The HOD devices of Example 3 and Comparative Examples 3 and 4 are measured with respect to luminance ($L_{max}$) and external quantum efficiency ($EQE_{max}$), and the results are shown in Table 5. The luminance and the external quantum efficiency are measured by using an M7000 QD-LED I-V-L test system equipment (Mcscience Inc.).

TABLE 5

| | Luminance ($L_{max}$, nit) | $EQE_{max}$ (%) |
|---|---|---|
| Example 3 | 63,649 | 11.5 |
| Comparative Example 3 | 16,174 | 3.4 |
| Comparative Example 4 | 56,710 | 9.5 |

Referring to Table 5, the HOD device of Example 3 exhibits excellent luminance ($L_{max}$) and external quantum efficiency ($EQE_{max}$), compared with the HOD devices of Comparative Examples 3 and 4.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: quantum dot device

11: first electrode

15: second electrode

12: hole auxiliary layer

13: self-assembled monolayer

14: quantum dot layer

What is claimed is:

1. A quantum dot device, comprising a first electrode and a second electrode, a quantum dot layer disposed between the first electrode and the second electrode, a hole auxiliary layer disposed between the quantum dot layer and the first electrode, wherein the hole auxiliary layer comprises $NiO_x$, wherein $1.1 \leq x \leq 1.5$, and a self-assembled monolayer disposed between the hole auxiliary layer and the quantum dot layer, the self-assembled monolayer comprising an organic compound represented by Chemical Formula 1:

Chemical Formula 1

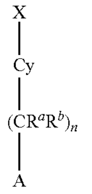

wherein, in Chemical Formula 1,

A is an anionic anchor group, $R^a$ and $R^b$ are each independently hydrogen, deuterium, a C1 to C10 alkyl group, or a C1 to C10 fluoroalkyl group, n is an integer from 0 to 3, Cy is a substituted or unsubstituted C6 to C30 aryl group, a substituted or unsubstituted C2 to C30 heteroaryl group, a substituted or unsubstituted C3 to C30 cycloalkyl group, or a substituted or unsubstituted C2 to C30 heterocycloalkyl group, and X is a hydrophobic substituted or unsubstituted C1 to C20 alkyl group, F, Cl, or I.

2. The quantum dot device of claim 1, wherein the compound represented by Chemical Formula 1 comprises an organic compound represented by Chemical Formula 1-1:

Chemical Formula 1-1

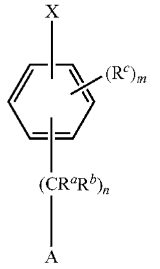

wherein, in Chemical Formula 1-1,

A is an anionic anchor group, $R^a$ and $R^b$ are each independently hydrogen, deuterium, a C1 to C10 alkyl group, or a C1 to C10 fluoroalkyl group, n is an integer from 0 to 3, $R^c$ is hydrogen, deuterium, or a C1 to C6 alkyl group, optionally, a CH of the benzene ring is replaced by N, m is an integer from 1 to 4, and X is a hydrophobic substituted or unsubstituted C1 to C20 alkyl group, F, Cl, or I.

3. The quantum dot device of claim 1, wherein the anionic anchor group A comprises a carboxyl group, a sulfonic acid group, a phosphoric acid group, a phosphonic acid group, or a salt thereof.

4. The quantum dot device of claim 1, wherein the hole auxiliary layer has a thickness of about 10 nanometers to about 100 nanometers.

5. The quantum dot device of claim 1, wherein a bandgap energy of the hole auxiliary layer is in a range of about 3.0 electronvolts to about 5.0 electronvolts.

6. The quantum dot device of claim 1, wherein an energy level of a valence band of the hole auxiliary layer is between a work function of the first electrode and a highest occupied molecular orbital energy level of the quantum dot layer.

7. The quantum dot device of claim 1, wherein an energy level of a valence band of the hole auxiliary layer is equal to or less than a highest occupied molecular orbital energy level of the quantum dot layer, and a difference between the energy level of the valence band of the hole auxiliary layer and the highest occupied molecular orbital energy level of the quantum dot layer is less than or equal to about 1.0 electronvolt.

8. The quantum dot device of claim 1, wherein an energy level of a conduction band of the hole auxiliary layer is less than a lowest unoccupied molecular orbital energy level of the quantum dot layer.

9. The quantum dot device of claim 1, wherein an energy level of a conduction band of the hole auxiliary layer is greater than a lowest unoccupied molecular orbital energy level of the quantum dot layer, and a difference between the energy level of the conduction band of the hole auxiliary layer and the lowest unoccupied molecular orbital energy level of the quantum dot layer is greater than or equal to about 0.5 eV.

10. The quantum dot device of claim 1, wherein a ratio of a thickness of the self-assembled monolayer to a thickness of the hole auxiliary layer 12 is in a range of about 0.01:1 to about 0.5:1.

11. A quantum dot device, comprising a first electrode and a second electrode, a quantum dot layer disposed between the first electrode and the second electrode, a hole auxiliary layer disposed between the quantum dot layer and the first electrode, wherein the hole auxiliary layer comprises nickel oxide, a self-assembled monolayer disposed between the hole auxiliary layer and the quantum dot layer, and an electron auxiliary layer comprising inorganic nanoparticles or an organic material, wherein the self-assembled monolayer comprises an organic compound represented by Chemical Formula 1:

Chemical Formula 1

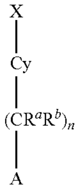

wherein, in Chemical Formula 1,

A is an anionic anchor group, $R^a$ and $R^b$ are each independently hydrogen, deuterium, a C1 to C10 alkyl group, or a C1 to C10 fluoroalkyl group, n is an integer from 0 to 3, Cy is a substituted or unsubstituted C6 to C30 aryl group, a substituted or unsubstituted C2 to C30 heteroaryl group, a substituted or unsubstituted C3 to C30 cycloalkyl group, or a substituted or unsubstituted C2 to C30 heterocycloalkyl group, and X is a hydrophobic substituted or unsubstituted C1 to C20 alkyl group or a halogen.

12. The quantum dot device of claim 11, wherein the inorganic nanoparticles comprise metal oxide nanoparticles represented by $Zn_{1-x}Q_xO$, wherein Q is a metal other than Zn, and $0 \leq x < 0.5$.

13. A quantum dot device, comprising a first electrode and a second electrode, a quantum dot layer disposed between the first electrode and the second electrode, a first hole auxiliary layer disposed between the quantum dot layer and the first electrode, wherein the first hole auxiliary layer comprises nickel oxide, a second hole auxiliary layer comprising an organic material between the first hole auxiliary layer and the quantum dot layer, and a self-assembled monolayer disposed between the first hole auxiliary layer and the quantum dot layer, wherein the self-assembled monolayer comprises an organic compound represented by Chemical Formula 1:

Chemical Formula 1

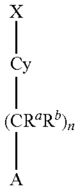

wherein, in Chemical Formula 1,

A is an anionic anchor group, $R^a$ and $R^b$ are each independently hydrogen, deuterium, a C1 to C10 alkyl group, or a C1 to C10 fluoroalkyl group, n is an integer from 0 to 3, Cy is a substituted or unsubstituted C6 to C30 aryl group, a substituted or unsubstituted C2 to C30 heteroaryl group, a substituted or unsubstituted C3 to C30 cycloalkyl group, or a substituted or unsubstituted C2 to C30 heterocycloalkyl group, and X is a hydrophobic substituted or unsubstituted C1 to C20 alkyl group or a halogen.

14. The quantum dot device of claim 1, wherein the quantum dot layer comprises a cadmium-free Group III-V semiconductor compound.

15. An electronic device comprising the quantum dot device of claim 1.

16. The quantum dot device of claim 1, wherein X is a C1 to C20 fluoroalkyl group or a C1 to C20 perfluoroalkyl group.

17. The quantum dot device of claim 1, wherein X is F.

18. The quantum dot device of claim 1, wherein X is Cl.

* * * * *